(12) United States Patent
Wang

(10) Patent No.: US 9,786,469 B2
(45) Date of Patent: Oct. 10, 2017

(54) THIN-ICE GRID ASSEMBLY FOR CRYO-ELECTRON MICROSCOPY

(71) Applicant: University of Washington, Seattle, WA (US)

(72) Inventor: Liguo Wang, Seattle, WA (US)

(73) Assignee: University of Washington, Seattle, WA (US)

( * ) Notice: Subject to any disclaimer, the term of this patent is extended or adjusted under 35 U.S.C. 154(b) by 0 days.

(21) Appl. No.: 15/233,176

(22) Filed: Aug. 10, 2016

(65) Prior Publication Data

US 2016/0351374 A1    Dec. 1, 2016

Related U.S. Application Data

(63) Continuation of application No. PCT/US2015/018686, filed on Mar. 4, 2015.
(Continued)

(51) Int. Cl.
*H01J 37/20* (2006.01)
*H01J 37/16* (2006.01)
(Continued)

(52) U.S. Cl.
CPC ............. *H01J 37/16* (2013.01); *C23F 1/40* (2013.01); *C23F 4/00* (2013.01); *H01J 37/20* (2013.01);
(Continued)

(58) Field of Classification Search
CPC .. H01J 37/20; H01J 37/16; H01J 37/26; H01J 37/261; G01N 1/42; G01N 1/00;
(Continued)

(56) References Cited

U.S. PATENT DOCUMENTS 5,352,898 A * 10/1994 Mehta .................. G01N 1/286
250/304
7,507,533 B2    3/2009 Bose et al.
(Continued)

FOREIGN PATENT DOCUMENTS

| EP | 2626884 | 8/2013 |
| WO | 2014125098 | 8/2014 |
| WO | 2015134575 | 9/2015 |

OTHER PUBLICATIONS

Parsons; Structure of Wet Specimens in Electron Microscopy; Science; Nov. 1, 1974; pp. 407-414; vol. 186, No. 4162; American Association for the Advancement of Science.
(Continued)

*Primary Examiner* — David A Vanore
(74) *Attorney, Agent, or Firm* — K&L Gates LLP

(57) ABSTRACT

A grid assembly for cryo-electron microscopy may be fabricated using standard nanofabrication processes. The grid assembly may comprise two support members, each support member comprising a silicon substrate coated with an electron-transparent silicon nitride layer. These two support members are positioned together with the silicon nitride layers facing each other with a rigid spacer layer disposed therebetween. The rigid spacer layer defines one or more chambers in which a biological sample may be provided and fast frozen with a high degree of control of the ice thickness.

13 Claims, 7 Drawing Sheets

Related U.S. Application Data

(60) Provisional application No. 61/947,740, filed on Mar. 4, 2014.

(51) Int. Cl.
    *H01J 37/26*     (2006.01)
    *C23F 1/40*     (2006.01)
    *C23F 4/00*     (2006.01)

(52) U.S. Cl.
    CPC ............ *H01J 37/26* (2013.01); *H01J 37/261* (2013.01); *H01J 2237/2001* (2013.01); *H01J 2237/2002* (2013.01); *H01J 2237/2003* (2013.01); *H01J 2237/2004* (2013.01)

(58) Field of Classification Search
    CPC .. G01N 1/2813; G01N 1/286; G01N 23/2204; G01N 23/2251; G01N 21/8483; G01N 33/383; B01L 9/00
    USPC .... 250/440.11, 443.1, 311, 442.11, 304, 306
    See application file for complete search history.

(56) References Cited

U.S. PATENT DOCUMENTS

| | | | | |
|---|---|---|---|---|
| 8,164,072 | B2* | 4/2012 | Lihl | G01N 1/42 250/306 |
| 8,513,622 | B2* | 8/2013 | Hartfield | F25D 3/107 250/440.11 |
| 8,884,248 | B2* | 11/2014 | Mulders | F25D 31/00 250/311 |
| 9,207,196 | B2* | 12/2015 | De Jonge | G01N 23/2204 |
| 2006/0017049 | A1 | 1/2006 | Pilla | |
| 2006/0169901 | A1 | 8/2006 | Nguyen-Huu et al. | |
| 2012/0120226 | A1 | 5/2012 | de Jonge | |
| 2015/0060364 | A1* | 3/2015 | McCutcheon | B01D 69/12 210/654 |
| 2016/0030941 | A1* | 2/2016 | Lihl | B01L 9/00 422/562 |
| 2016/0351374 | A1* | 12/2016 | Wang | H01J 37/26 |

OTHER PUBLICATIONS

Dubochet; Cryo-electron Microscopy of Vitrified Specimens; Quarterly Review of Biophysics; 1988; pp. 129-228; European Molecular Biology Laboratory; Heidelberg, Germany.

Jakubowski; Evaporated Carbon Stabilizes Thin, Frozen-Hydrated Specimens; Ultramicroscopy; Sep. 12, 1989; pp. 351-356; Elsevier Science Publishers B.V.; North Holland.

Uchikoga; A Back-side Passivation Film on a-Si:H Thin Film Transistor; Journal of Applied Physics; Aug. 15, 1994; pp. 2484-2489; vol. 76, No. 4; American Institute of Physics.

Williamson; Dynamic Microscopy of Nanoscale Cluster Growth at the Solid-Liquid Interface; Nature Materials; Jul. 20, 2003; pp. 532-536; vol. 2; Nature Publishing Group.

Glaeser; Specimen Charging on Thin Films with One Conducting Layer: Discussion of Physical Principles; Microscopy and Microanalysis; pp. 790-796; Jan. 26, 2004; Microscopy Society of America.

Downing; Experimental Characterization and Mitigation of Specimen Charging on Thin Films with One Conducting Layer; Microscopy and Microanalysis; pp. 783-789; Jan. 26, 2004; Microscopy Society of America.

Cheng; Does Contamination Buildup Limit Throughput for Automated CryoEM?; Journal of Structural Biology; Apr. 5, 2006; pp. 303-311; Elsevier Inc.

Tang; EMAN2: An Extensible Image Processing Suite for Electron Microscopy; Journal of Structural Biology; Jun. 8, 2006; pp. 38-46; Elsevier Inc.

Quispe; An Improved Holey Carbon Film for Cryo-Electron Microscopy; Microscopy; Journal of Structural Biology; May 15, 2007; pp. 365-371; Microscopy Society of America.

Jiang; Backbone Structure of the Infectious ε15 Virus Capsid Revealed by Electron Cryomicroscopy; Nature Letters; Feb. 28, 2008; pp. 1130-1135; vol. 451; Nature Publishing Group.

Ludtke; De Novo Backbone Trace of GroEL from Single Particle Electron Cryomicroscopy; Structure; Mar. 2008; pp. 441-448; vol. 16; Elsevier Ltd.

Wang; Streptavidin Crystals as Nanostructured Supports and Image-Calibration References for Cryo-EM Data Collection; J Struct Biol.; Nov. 2008; 20 pgs.; vol. 164, No. 2; Elsevier Inc.

Yu; Å Structure of Cytoplasmic Polyhedrosis Virus by Cryoelectron Microscopy; Nature; May 15, 2008; pp. 415-419; Nature Publishing Group.

De Jonge; Electron Microscopy of Whole Cells in Liquid with Nanometer Resolution; Proceedings of the National Academy of Sciences; Feb. 17, 2009; pp. 2159-2164; vol. 106, No. 7; National Academy of Sciences of the USA.

Yoshioka; Cryomesh™: A New Substrate for Cryo-Electron Microscopy; Microscopy and Microanalysis; pp. 43-53; Nov. 30, 2009; Microscopy Society of America.

Peckys; Nanoscale Imaging of Whole Cells Using a Liquid Enclosure and a Scanning Transmission Electron Microscope; PLOS One; Dec. 2009; 7 pgs.; vol. 4, No. 12; plosone.org.

Zhang; Mechanism of Folding Chamber Closure in a Group II Chaperonin; Nature; Jan. 21, 2010; pp. 379-383; Nature Publishing Group.

Karazhanov; Doping-Induced Modulation of Electrical and Optical Properties of Silicon Nitride; Thin Solid Films; Feb. 19, 2010; pp. 4918-4922; Elsevier B.V.

Cong; 4.0—Å Resolution Cryo-EM Structure of the Mammalian Chaperonin TRiC/CCT Reveals its Unique Subunit Arrangement; Proceedings of the National Academy of Sciences; Mar. 16, 2010; pp. 4967-4972; vol. 107, No. 11; National Academy of Sciences of the USA.

Liu; Atomic Structure of Human Adenovirus by CryoEM Reveals Interactions Among Protein Networks; Science; Aug. 27, 2010; 14 pgs.; www.sciencemag.org.

Ring; Silicon Nitride Windows for Electron Microscopy of Whole Cells; Journal of Microscopy; Mar. 17, 2011; pp. 273-283; vol. 243; Royal Microscopical Society.

Peckys; Fully Hydrated Yeast Cells Imaged with Electron Microscopy; Biophysical Journal; Mar. 30, 2011; pp. 2522-2529; vol. 100; Biophysical Society.

Larson; The Surface of Evaporated Carbon Films Is an Insulating, High-Bandgap Material; Journal of Structural Biology; May 2011; 8 pgs; vol. 174, No. 2; Elsevier Inc.

Ge; Hydrogen-Bonding Networks and RNA Bases Revealed by Cryo Electron Microscopy Suggest a Triggering Mechanism for Calcium Switches; Proceedings of the National Academy of Sciences; Jun. 7, 2011; pp. 9637-9642; vol. 108, No. 23; National Academy of Sciences of the USA.

Evans; Controlled Growth of Nanoparticles from Solution with In Situ Liquid Transmission Electron Microscopy; Nano Lett.; Jul. 13, 2011; 10 pgs.

Ludtke; Flexible Architecture of IP3R1 by Cryo-EM; Structure; Aug. 10, 2011; 17 pgs.

Jinschek; Image Resolution and Sensitivity in an Environmental Transmission Electron Microscope; Micron; Jan. 21, 2012; pp. 1156-1168; Elsevier Ltd.

Mirsaidov; Imaging Protein Structure in Water at 2.7 nm Resolution by Transmission Electron Microscopy; Biophysical Journal; Feb. 2012; pp. L15-L17; Vo. 102; Biophysical Society.

Author Unknown; Smart Tem Grids™, Active Substrates for the Next-Generation of Electron Microscopy; Dune Sciences; 2013; 1 pg.

Author unknown; International Search Report and Written Opinion of PCT/US2015/018686; dated Jul. 7, 2015; 11 pgs.

* cited by examiner

US 9,786,469 B2

THIN-ICE GRID ASSEMBLY FOR CRYO-ELECTRON MICROSCOPY

CROSS-REFERENCE TO RELATED APPLICATIONS

This application is a continuation of International Application No. PCT/US2015/018686, filed Mar. 4, 2015, which claims the benefit of U.S. Provisional Application No. 61/947,740, filed Mar. 4, 2014, the contents of each are incorporated herein by reference in their entirety.

FIELD

This application relates to systems and methods for cryo-electron microscopy.

BACKGROUND

Cryo-electron microscopy (cryo-EM) is a powerful technique involving the imaging of biological materials in a transmission electron microscope under cryogenic conditions. Cryo-EM may be used to study structures of radiation-sensitive specimen, such as biological macromolecules and complexes, which are embedded in a thin film of vitreous ice. Atomic resolution structures have been determined by cryo-EM, and all-atom models have been built. Cryo-EM has also been employed in other scientific fields such as material science (e.g., phase separation of blend polymers, self-assembled nanostructures), nanomedicine (e.g., nanostructured materials for intracellular delivery of agents), and renewable energy (e.g., nanostructured materials for solar cells).

In cryo-EM, one limiting factor in the image contrast, and thus the resolution of the determined structure, is the ice thickness. The thicker the ice layer is, the lower contrast the cryo-EM images have. Experiments have shown that by extensive efforts to optimize the vitrification process, the contrast of recorded cryo-EM images increased dramatically. Currently, the freezing process is still a trial and error method, and there is very poor control of the ice thickness. Typically, several cryo-samples are prepared on Transmission Electron Microscopy (TEM) grids under a variety of conditions, with the hope that one of those conditions will produce a vitrified sample having the desired ice thickness. Each of these samples has to be screened using cryo-EM in order to identify whether the sample has achieved the desired ice thickness. This process is time consuming, labor intensive, and is wasteful in that it results in the excessive usage of the TEM, and loss of the biological material in the unsuccessful samples. Moreover, despite the use of multiple samples, there is still no assurance that the desired thickness will be achieved, due to the unpredictability of the process.

Accordingly, there is a need for improved systems and methods for cryo-EM.

SUMMARY

Systems and methods are provided for performing cryo-electron microscopy (cryo-EM). In accordance with embodiments of the present invention, a system for cryo-electron microscopy is provided, comprising: a first support member comprising a first substrate coupled to a first electron-transparent layer, wherein the first substrate comprises one or more lower openings; a second support member comprising a second substrate coupled to a second electron-transparent layer, wherein the second substrate comprises one or more upper openings; and a rigid spacer layer disposed between the first support member and the second support member.

In some embodiments, the one or more lower openings comprise a first plurality of channels extending in a first direction; and the one or more upper openings comprise a second plurality of channels extending in a second direction substantially orthogonal to the first direction such that each channel in the first plurality of channels overlaps with each of the second plurality of channels, wherein the portions of overlapping channels form a plurality of apertures through which electrons may pass.

The rigid spacer layer may comprise silicon dioxide or metal deposited on the first or the second support member. The spacer layer may form one or more chambers, each chamber being aligned with one of the lower openings and one of the upper openings to form a aperture such that electron beams may pass through the one of the lower openings, the chamber, and the one of the upper openings.

In accordance with embodiments of the present invention, a method of performing cryo-electron microscopy is provided, comprising: providing a first support member comprising a first substrate coupled to a first electron-transparent layer, wherein the first substrate comprises one or more lower openings; depositing an aqueous sample on the first electron-transparent layer of the first support member; providing a second support member comprising a second substrate coupled to a second electron-transparent layer, wherein the second substrate comprises one or more upper openings; positioning the second electron-transparent layer of the second support member on the aqueous sample, whereby the second electron-transparent layer is separated from the first electron-transparent layer by a rigid spacer layer; and freezing the aqueous sample to produce a vitrified sample between the first electron-transparent layer and the second electron-transparent layer. The cryo-sample may be imaged by directing an electron beam through the one or more lower openings in the first substrate, the first electron-transparent layer, the vitrified sample, the second electron-transparent layer, and the one or more upper openings in the second substrate.

In accordance with embodiments of the present invention, a method of manufacturing a cryo-electron microscopy grid assembly is provided, comprising: providing a first support member comprising a first substrate coupled to a first electron-transparent layer, wherein the first substrate comprises one or more lower openings; and depositing a rigid spacer layer on the first electron-transparent layer, the rigid spacer layer forming one or more chambers, each chamber being aligned with one or more of the lower openings.

In some embodiments, the providing the first support member comprises: depositing the first electron-transparent layer on a silicon wafer; etching the one or more lower openings in the silicon wafer; and dicing the silicon wafer into a plurality of first support members.

In some embodiments, the depositing the first electron-transparent layer on the silicon wafer comprises depositing silicon nitride on the silicon wafer. In some embodiments, the depositing the rigid spacer layer comprises: depositing the rigid spacer layer comprising silicon dioxide or metal on the first electron-transparent layer at a predetermined thickness; and etching the rigid spacer layer to form the one or more chambers.

Still other embodiments of the present invention will become readily apparent to those skilled in the art from the following detailed description, wherein are described embodiments by way of illustrating the best mode contemplated for carrying out the invention. As will be realized, the invention is capable of other and different embodiments and its several details are capable of modifications in various obvious respects, all without departing from the spirit and the scope of the present invention. Accordingly, the drawings and detailed description are to be regarded as illustrative in nature and not as restrictive.

DETAILED DESCRIPTION

Figure 1:
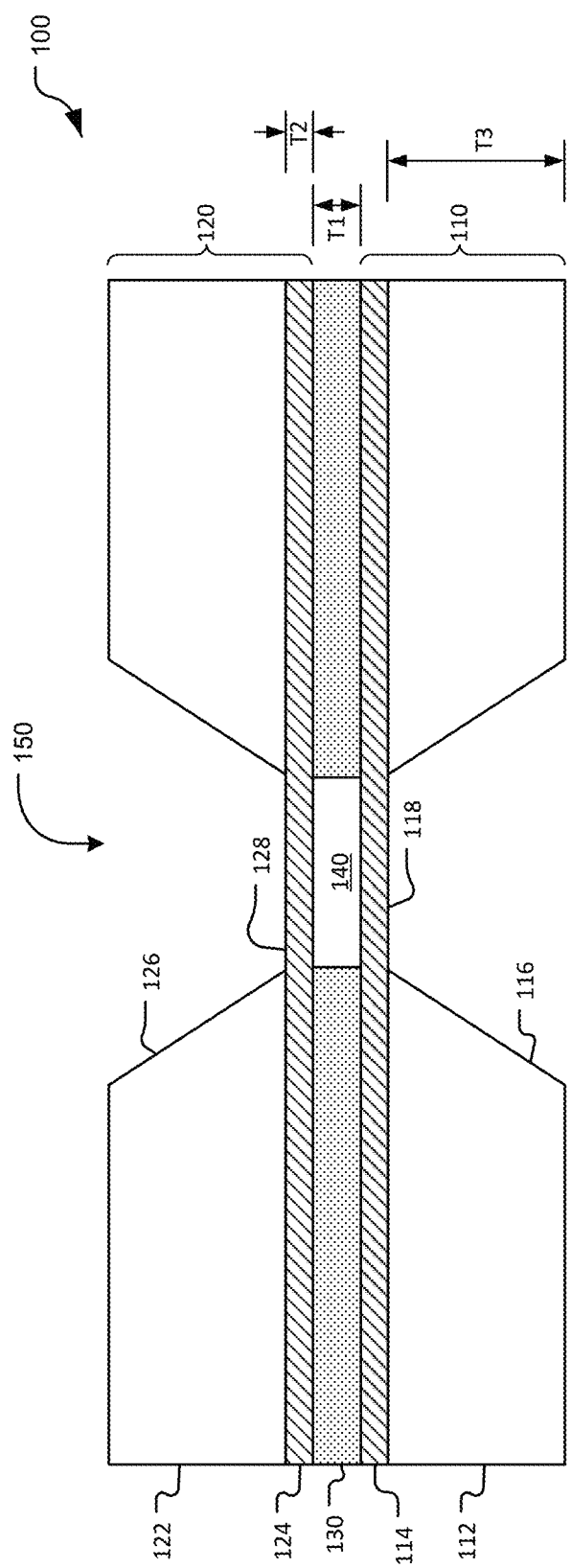
FIG. 1 is a cross-sectional view of a thin-ice grid assembly for cryo-EM, in accordance with embodiments of the present invention.

In accordance with embodiments of the present invention, a grid assembly for cryo-EM, referred to herein as a thin-ice grid assembly or TEM grid, may be fabricated using standard nanofabrication processes. The grid assembly comprises two support members, each support member comprising a silicon (Si) substrate coated with an electron-transparent silicon nitride layer (Si3N4). Windows are etched from each Si substrate to expose the silicon nitride layer below. These two support members are positioned together with the silicon nitride layers facing each other with a rigid spacer layer disposed therebetween. The rigid spacer layer defines one or more chambers between the two silicon nitride layers. The spacer layer may comprise, for example, a silicon dioxide (SiO2) layer deposited on the silicon nitride layer of one of the support members.

Biological samples in aqueous solutions are trapped in the chambers between the two support members. The height of the chambers is defined by the thickness of the rigid spacer layer, which can be very precisely controlled using standard nanofabrication techniques. By providing precise control of the spacer layer thickness, the thickness of the aqueous layer between the two silicon nitride layers, and, therefore, the thickness of the vitrified biological sample, can be controlled. In accordance with some embodiments, to reduce the possible effect of specimen charging during the cryo-EM imaging process, a thin carbon film may optionally be deposited on the silicon nitride film.

In accordance with embodiments of the present invention, the grid assembly can make the vitrification process a well-controlled step, and thereby provide increased certainty that the ice will have the desired thickness for effective imaging. The use of the grid assembly may eliminate the intensive labor involved with the preparation and cryo-EM screening of multiple samples, and may also result in maximized contrast of cryo-EM images and higher resolution of the determined biological structure. In addition, the biological sample volume required for the cryo-EM imaging may be decreased by a factor of up to 100-10,000. The grid assembly may substantially increase the efficiency and success rate of cryo-EM in structural biology and accelerate the understanding of structure-function relationships at molecular level, which may in turn facilitate the development of new therapeutic agents to treat diseases in broad areas.

Cryo-EM is a powerful modern technique used to determine three-dimensional (3D) structures of biological macromolecules and complexes preserved in their "native" noncrystalline states. The achieved resolution by cryo-EM has improved steadily in recent years. To date, about 80 proteins structures have been determined at a resolution better than 4 Å, and atomic models have been built.

In cryo-EM, the image intensity is a reflection of the electron phase shift due to electrostatic potentials, including the internal potentials of the atoms in the specimen. In the weak-phase approximation, the Fourier transform $\hat{I}(s)$ of the image intensity $I(x,y)$ is most readily expressed in terms of the two-dimensional spatial frequency s, as:

$$\hat{I}(s) = \hat{I}_0[\delta(s) + 2h(s)\hat{\phi}(s)]$$

In the equation above, $\hat{I}_0$ is the mean image intensity, $\delta(s)$ is the two dimensional Dirac delta function, and $h(s)$ is the contrast transfer function (CTF). The function $\hat{\phi}(s)$ is the Fourier transform of the specimen's phase shift $\phi(x,y)$. The image contrast depends on a number of factors including the ice thickness, as unstained biological specimens are embedded in a thin film (e.g., ~100 nm) of vitreous ice:

$$C = \frac{\Delta I}{I_s} = \frac{(\varphi_{protein} - \varphi_{water}) \cdot t_{protein}}{\varphi_{water} \cdot t_{ice}}$$

In the equation above, $\phi_{protein}$ and $\phi_{water}$ are phase shifts of electrons passing through protein and water regions, and $t_{protein}$ and $t_{ice}$ are the thicknesses of the protein molecules and ice layer, respectively. The calculated image contrast drops dramatically as the ice thickness increases from, e.g., 10 nm to 100 nm. The protein particles may be clearly seen when contained in a thin ice layer, but not in a thick ice layer. Experiments have shown that by extensive efforts to optimize the vitrification process, the contrast of recorded cryo-EM images may increase dramatically.

Conventional cryo-EM techniques provide poor control of the ice thickness, requiring multiple trial and attempts at the freezing process. At room temperature and 50% relative humidity, a 102 nm thick water layer will evaporate completely in approximately one second. To reduce the evaporation during the handling of the specimen, very expensive equipment is sometimes used to provide a humidity-controlled environment in which the specimen is frozen. This equipment can provide improved control over the physical and mechanical conditions, including control of temperature, relative humidity, blotting conditions and freezing velocity. One such tool is the Vitrobot, by FEI. However, this equipment can be very expensive, and even when using this equipment, cryo-samples under two to three different conditions varied around the optimal condition may need to be prepared in hope of having one vitrified sample with the right ice thickness. Then different regions in each cryo-sample must be screened using cryo-EM to determine whether that sample has achieved the desired ice thickness. This is time consuming and labor intensive, and still no guarantee for success.

In accordance with embodiments of the present invention, a grid assembly may be used to control the ice thickness for cryo-EM imaging. This grid assembly may eliminate the need to test different vitrification conditions, and to screen many cryo-samples or many regions in each cryo-sample in order to identify a successful sample. This can make the vitrification process a well-controlled step, and provide greater control over the ice thickness.

FIG. 1 is a cross-sectional view of a thin-ice grid assembly 100 for cryo-EM, in accordance with embodiments of the present invention. The grid assembly 100 comprises two support members, first support member 110 and second support member 120. Each support member 110, 120 comprises a silicon chip substrate 112, 122, coated with a silicon nitride layer 114, 124. The silicon nitride layers 114, 124 form electron-transparent layers through which an electron beam from a TEM may pass. The two support members 110, 120 are positioned such that the two silicon nitride layers 114, 124 are facing each other inside the grid 100. One or more openings 116, 126, are formed in each of the silicon substrates 112, 122, respectively. These openings 116, 126 slope downwards at an angle to form observation windows 118, 128, exposing the silicon nitride layers 114, 124 below. During imaging, the electron beams are directed through these windows 118, 128.

A rigid spacer layer 130 is positioned between the two support members 110, 120. The spacer layer 130 defines one or more chambers 140 between the windows 118, 128, in which the biological material is deposited for freezing and imaging. In some embodiments, the spacer layer 130 comprises a silicon dioxide (SiO2) layer deposited on the first support member 110. When the second support member 120 is positioned on the first support member 110, the spacer layer 130 retains a fixed distance between the silicon nitride layers 114, 124 of the two support members 110, 120, thereby providing a specimen chamber 140 having a fixed height. Accordingly, the thickness T1 of the spacer layer 130 determines the thickness of the biological sample contained in the chamber 140. The aqueous sample in the chamber 140 can be fast frozen by plunging the grid assembly 100 into a cryogen, such as liquid ethane cooled by liquid nitrogen. Due to the fast freezing process, the volume of the amorphous vitrified biological sample in the chamber 140 does not change from the volume of the liquid sample.

It is to be understood that these drawings contained herein are not drawn to scale, and the relative thicknesses of the various layers of the grid assembly 100 may not necessarily correspond to the thicknesses of actual structures. In some embodiments, each of the substrates 112,122 may comprise, e.g., a silicon chip substrate having a thickness, T3, of between about 100 μm and about 300 μm. Generally, a thinner substrate 112, 122 may be more desirable so as to improve the speed with which the biological samples are frozen. However, an increased thickness for the substrate 112, 122 is desirable to increase the strength and durability of the first support member 110 and second support member 120. This is desirable to prevent damage to the grid 110 during the various handling steps described herein. Suitable silicon chip substrates are commercially available in a variety of sizes.

The electron-transparent layers 114, 124 may comprise, e.g., silicon nitride layers having a thickness, T2, of between about 10 nm and about 30 nm. Generally, a thinner electron-transparent layer is desirable, so as to reduce the noise and other degradation caused by the electron-transparent layer during imaging. However, an increased thickness is desirable to reduce the likelihood of damage to the layers 114, 124 during handling. Similarly, larger observation windows 118, 128 may be desirable so as to provide a larger field of view. However, thinner and larger windows 118, 128 may be less able to survive the handling steps without damage.

It is to be understood that the term "electron-transparent" as used herein does not require 100% transparency to electrons. Instead, any type of material that permits an adequate amount of electron transparency for the purposes of imaging the biological material contained inside the grid assembly 100 may be used.

The spacer layer 130 may comprise, e.g., a SiO2 layer having a thickness, T1, of between about 10 nm and about 300 nm. The thickness T1 of the spacer layer 130 may be varied, depending on the desired thickness of the vitreous ice sample. If smaller biological structures are being imaged, it may be desirable to select a first substrate 110 having a thinner (e.g., 10 nm) SiO2 spacer layer 130, and if larger structures are being imaged, a thicker spacer layer 130 may be selected. In other embodiments, the spacer layer 130 may comprise any material sufficiently rigid as to maintain a fixed distance between the first substrate 110 and second substrate 120. In addition, it is desirable to use a material that provides good control over the thickness of the spacer layer 130. These characteristics can help to provide more consistent results when freezing and imaging multiple samples. For example, using current nanofabrication processes, a spacer layer 130 made of SiO2 may be formed at a variety of thicknesses with an accuracy of +/−1 nm. In other embodiments, the spacer layer 130 may comprise a metal or metal alloy, such as, e.g., chromium, which also provides extremely accurate control over the deposition thickness.

In the illustrated embodiments, the substrate 112 and substrate 122 are substantially identical in material and dimensions. In other embodiments, different materials may be used. For example, if the spacer layer 130 coupled to the first substrate 112 is formed of a sufficiently strong and durable material (e.g., SiO2 or metal), it may be possible to use a thinner layer for the first substrate 112 than used for the second substrate 122 and still achieve the desired resistance to damage during handling. Similarly, the materials and dimensions of the electron-transparent layers 114, 124 may be the same or different between the first and second support members 110, 120.

Figure 2A:
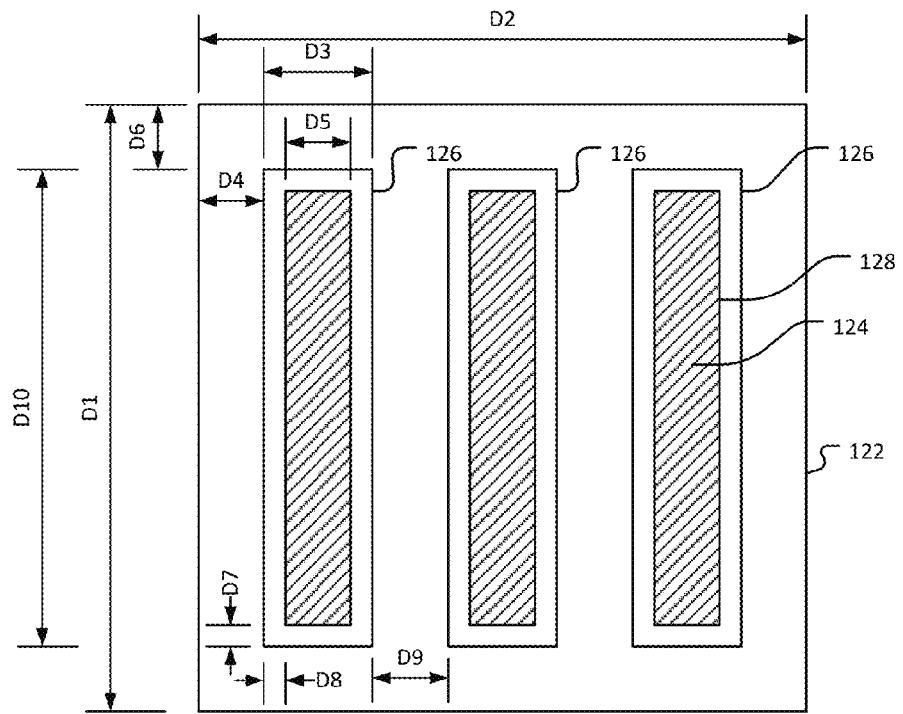
FIGS. 2A-2B are top and bottom views, respectively, of the grid assembly.
Figure 2B:
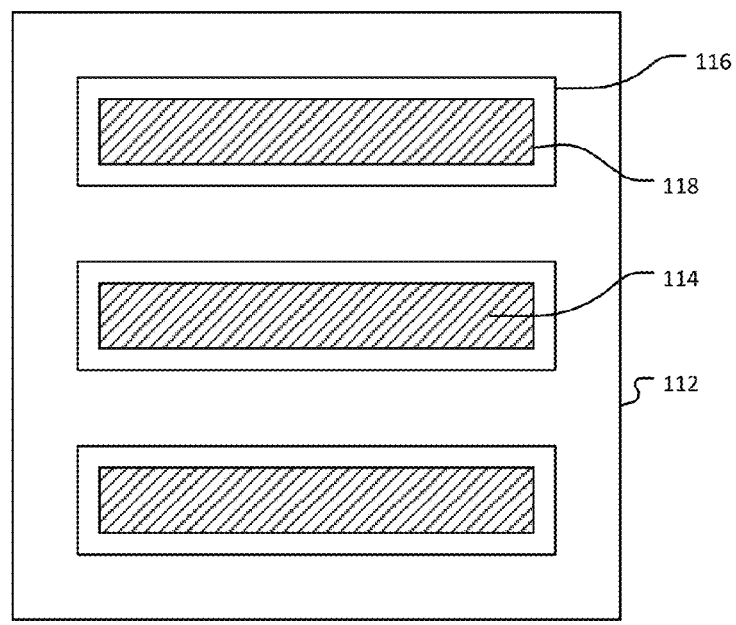

FIGS. 2A-2B are top and bottom views, respectively, of the grid assembly 100. In FIG. 2A, the upper surface of the substrate 122 of the second support member 120 is shown. In the illustrated embodiment, the second support member 120 defines three rectangular openings 126 extending in a first direction (the y-direction, as shown in FIG. 2A). The windows 128 expose rectangular regions of the silicon nitride layer 124 below, thereby forming elongated electron-transparent windows 128 for imaging.

In FIG. 2B, the lower surface of the substrate 112 of the first support member 110 is shown. In the illustrated embodiment, the first support member 110 defines three rectangular openings 116, which form windows 118 exposing the silicon nitride layer 114 below, similar to the windows 128 in the second support member 120. However, when the first support member 110 and second support member 120 are coupled, the support members 110, 120 are oriented such that the openings 116 in the first support member 110 extend in a direction substantially orthogonal to the direction of the openings 126.

The dimensions and shapes of the substrates 112, 122, openings 116, 126, and windows 118, 128 may vary. In the illustrated embodiment, the substrates 112, 122 have a height D1 and width D2 of about 2120 µm each. In other embodiments, the substrates 112, 122 need not be square (e.g., rectangular, octagonal, circular, oval, etc.) and may have a different height D1 than width D2. Each of the windows 118, 128 has a width D5 of about 200 µm and a length of about 1480 µm. Each of the openings 116, 126 has a width D3 of about 440 µm and a length D10 of about 1720 µm. The openings 116, 126 may be formed at distance D4 of about 200 µm from a first edge of the substrate 112, 122, a distance D6 of about 200 µm from a second edge of the substrate 112, 122, and a distance D9 of about 200 µm from the adjacent opening 116, 126.

Figure 3A:
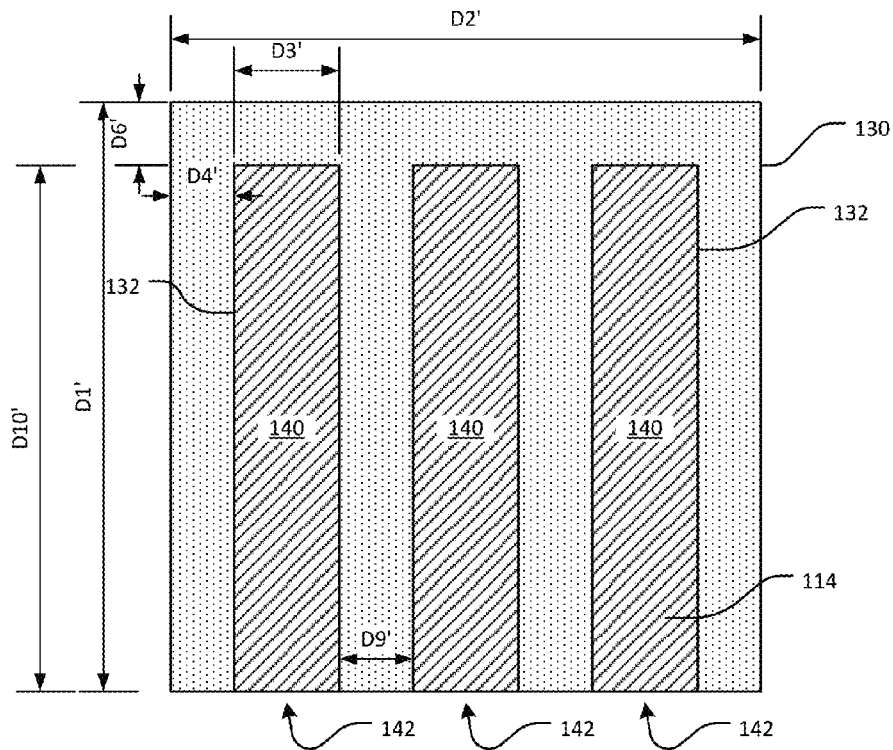
FIG. 3A shows an upper view of a first support member with a spacer layer, in accordance with embodiments of the present invention.

FIG. 3A shows an upper view of the first support member 110 with the spacer layer 130 formed thereon, in accordance with embodiments of the present invention. As described above, the spacer layer 130 may comprise a SiO2 layer deposited on the first support member 110. Portions of the SiO2 layer may be removed via etching to form channels 132 (e.g., three channels 132, as shown in FIG. 3A). The walls of the channels 132 along with the silicon nitride layers 114, 124 above and below the spacer layer 130 define three chambers 140, which are used to retain the biological sample.

In the illustrated embodiment, one end of each of the chambers 140 forms an exit portion 142 which is exposed on the outside of the grid assembly 100, and the other end of the chambers 140 is closed. In other embodiments, the chambers 140 may extend across the length D1' of the spacer layer 130, thereby forming exit portions on both ends of the chamber 140.

In the illustrated embodiment, the spacer layer 130 forms chambers 140 having a width D3' of about 440 µm, a distance from a first edge of the substrate 112 D4' of about 200 µm, a distance from a second edge of the substrate 112 D3' of about 200 µm, and spacing between adjacent chambers 140 D9' of about 200 µm. The chambers 140 are arranged to approximately align with the openings 126 in the second substrate 122 when the first support member 110 and second support member 120 are coupled. However, the chambers 140 have a length D10' of about 1920 µm, which is longer than the length D10 of the openings 126, because the chambers 140 extend to the edge of the second substrate 112.

Figure 3B:
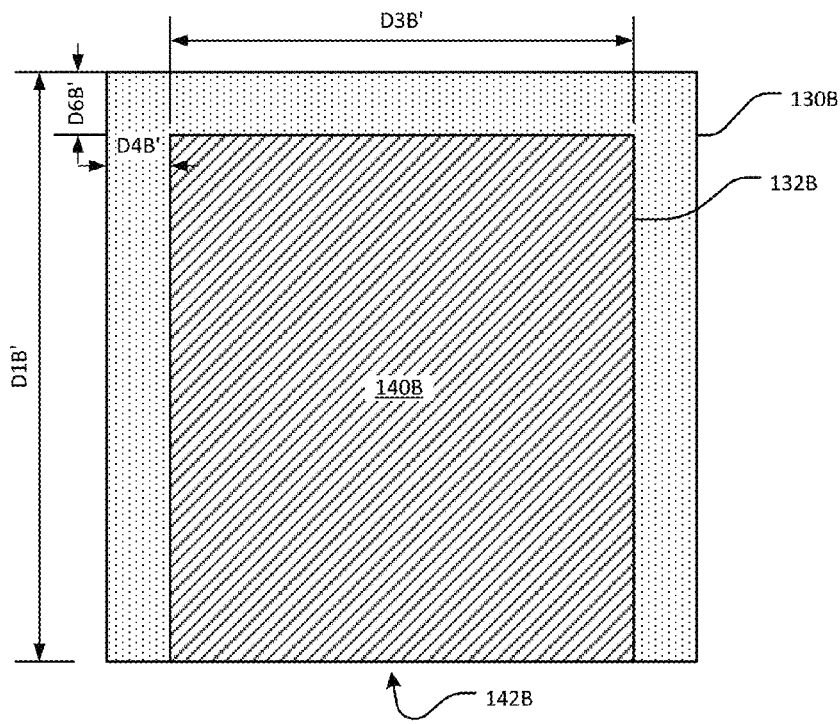
FIG. 3B shows an upper view of a first support member with a spacer layer, in accordance with other embodiments of the present invention.

In other embodiments, the spacer layer 130 may have different dimension or shapes than that shown in FIG. 3A, and may differ from the openings 126. For example, FIG. 3B shows another embodiment of a spacer layer 130' forming a single chamber 140'. The overall width D3B' of the chamber 140B is about 1720 µm, so as to extend across all of the openings 126 in the second substrate 122. The distances from the edges D4B' and D6B' may be larger, smaller, or about the same as the distances D4 and D6.

Figure 4:
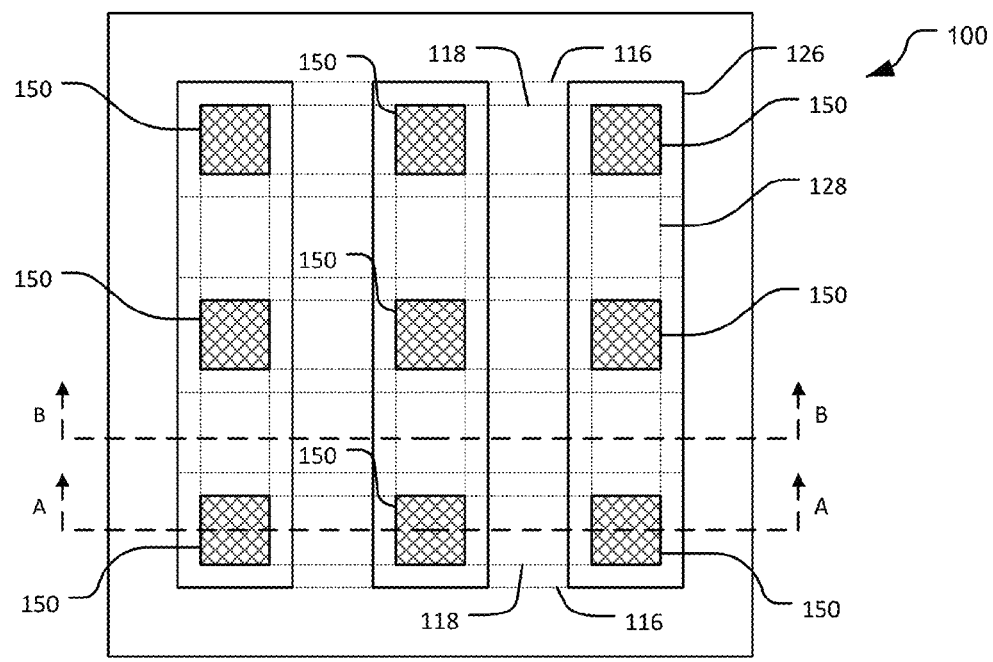
FIG. 4 is a top view of a first support member coupled with a second support member to form a plurality of imaging apertures, in accordance with embodiments of the present invention.

FIG. 4 is a top view of the first support member 110 coupled with the second support member 120 to form a plurality of imaging apertures 150 through which electron beams may be directed. As described above with respect to FIGS. 2A-2B, during use, the first support member 110 and second support member 120 are coupled such that the openings 116 in the first support member 110 extend in a direction substantially orthogonal to the direction of the openings 126 in the second support member 120. Accordingly, the elongated windows 118 in the first support member 110 extend in a direction substantially orthogonal to the elongated windows 128 in the second support member 120.

In FIG. 4, the openings 116 and windows 118 in the first support member 110 are shown with dashed lines because the first support member 110 is positioned below the second support member 120, and therefore the openings 116 and windows 118 would not be visible in the illustrated view. However, FIG. 4 illustrates how portions of the windows 118 in the first support member 110 align with the windows 128 in the second support member 120. The regions where the windows 118, 128 overlap form a plurality of imaging apertures 150.

Figure 5A:
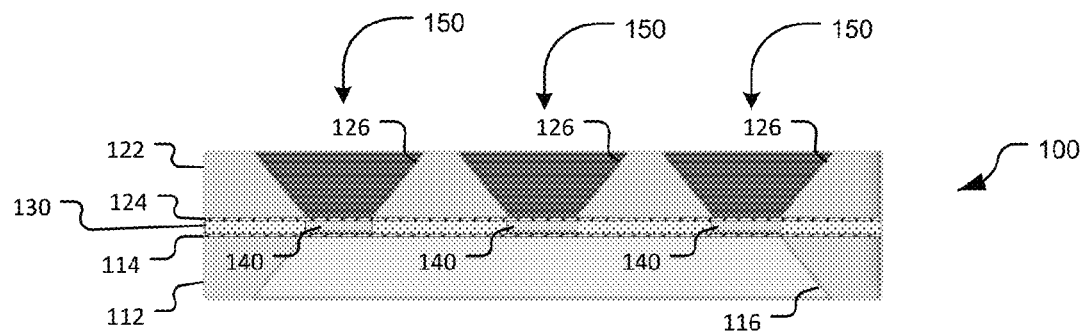
FIGS. 5A-5B illustrate cross-sectional views of a grid assembly, in accordance with embodiments of the present invention.
Figure 5B:
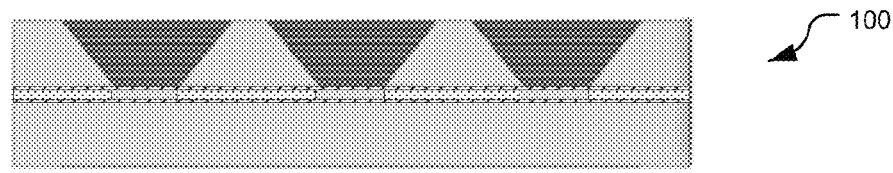

FIG. 5A illustrates a cross-sectional view of the grid assembly 100 taken along line A-A in FIG. 4, which shows three regions where the openings 126 in the second support grid 120 align with one of the openings 116 in the first support grid 110 below. Each of these regions forms an aperture 150. In contrast, FIG. 5B illustrates a cross-sectional view of the grid assembly 100 taken along line B-B in FIG. 4. In FIG. 5B, the openings 126 do not align with one of the openings 116, and therefore the openings 126 are blocked by the first silicon substrate 112.

As can be seen in FIGS. 4, 5A, and 5B, the imaging apertures 150 correspond to the portions of the chambers 140 that are blocked only by the electron-transparent silicon nitride layer 124, and are not blocked by the substrates 112, 122 and the spacer 130. As a result, electron beams can be directed through the apertures 150 to image the vitreous biological material contained in the chambers 140.

Figure 6A:
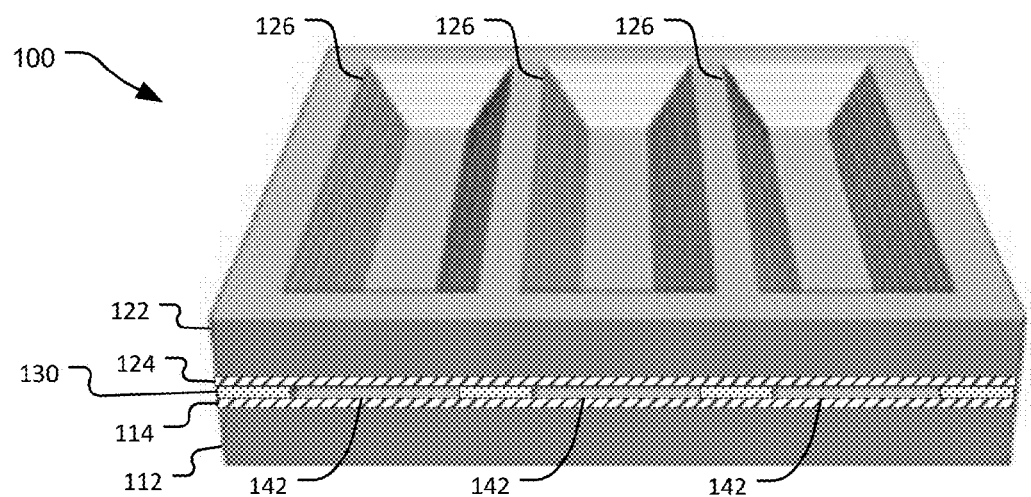
FIGS. 6A-6B are upper and lower perspective views of the grid assembly, in accordance with embodiments of the present invention.
Figure 6B:
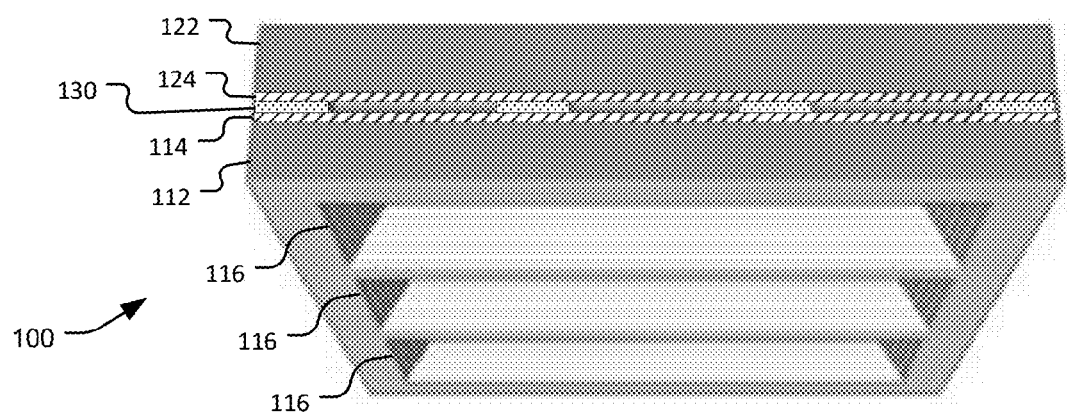

FIG. 6A is an upper perspective view of the grid assembly 100 with the first support grid 112 coupled with the second support grid 122, and FIG. 6B is a lower perspective view of the grid assembly 100 with the first support grid 112 coupled with the second support grid 122.

Figure 7:
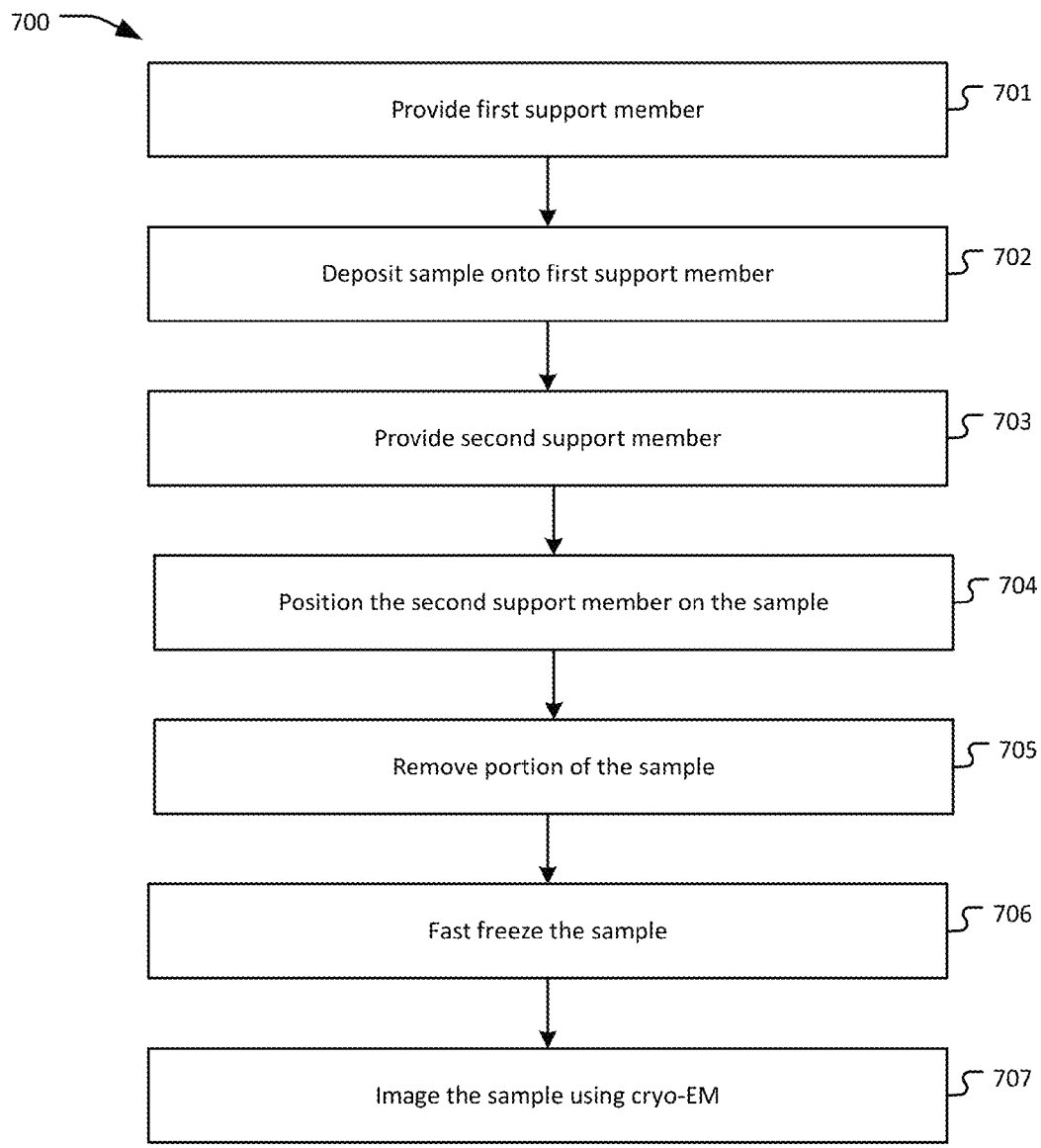
FIG. 7 is a flowchart illustrating a method of performing cryo-electron microscopy using a grid assembly, in accordance with embodiments of the present invention.

FIG. 7 is a flowchart illustrating a method of performing cryo-electron microscopy using a grid assembly, in accordance with embodiments of the present invention. In step 701, the first support member 110 is provided. As described above, the first support member 110 comprises a silicon substrate 112 coated with a silicon nitride layer 114, and having a rigid spacer layer 130 formed on the silicon nitride layer 114. The substrate 112 defines one or more openings 116 exposing the silicon nitride layer 114 to form observation windows 118.

In step 702, a biological sample in aqueous solution is deposited onto the top surface of the first support member 110. The sample can be deposited by any suitable method and in any desired volume (e.g., 0.025 µl).

In step 703, a second support member 120 is provided. In step 704, the second support member 120 is positioned onto the biological sample and the first support member 110. The chambers 140 may have capacity to contain only an extremely small volume of biological sample (e.g, approximately 0.00025 µl for 100-nm-thick ice). In order to avoid a change in the solute concentration due to water evaporation after sample loading but before the support members 110, 120 are coupled to seal the chambers 140, it may be desirable to deposit a far greater volume of sample than needed to fill the chambers 140. For example, 100 times more sample (e.g. approximately 0.025 µl) can be loaded onto the bottom support member 110. After the second support member 120 is positioned on top of the sample, a portion of the solution will be forced outwards and off of the first support member by the pressure from the second support member 120. However, it is likely that there will still remain excess solution trapped between the first and second support members 110, 120. As a result, the second support member 120 may be supported by the sample at a distance from the spacer layer 130. In step 705, a portion of the biological sample is removed so as to permit the second support member 120 to rest on the spacer 130. At this point, the height of the chamber 140 is defined by the thickness of the spacer 130. Therefore, the sample contained in the chamber 140 will have the desired thickness.

The excess biological sample can be removed from between the first and second support grids 110, 120 in a variety of ways. For example, an absorbent material such as filter paper may be positioned adjacent to the exit portions 142 of the chambers 140. The excess sample will be drawn out by the filter paper until the second support member 120 contacts the spacer layer 130. Typically, the surface tension of the biological sample is sufficient to retain the second support member 120 coupled to the first support member 110. In some embodiments, it may be desirable to provide some sort of clamping force or clamping mechanism to maintain that coupling. Despite the deposition of a much larger volume of solution than necessary to fill the chambers 140, the total volume of solution used to fill the grid assembly 100 may still be far less than the typical amount of solution used in conventional cryo-sample preparation (e.g. approximately 3 µl).

In step 706, the biological sample contained in the chambers 140 between the first and second support members 110, 120 is fast frozen. This can be accomplish manually, for example, by gripping the grid assembly 100 with a pair of tweezers and plunging the grid assembly 100 into a cryogen, such as, e.g., liquid nitrogen cooled liquid ethane. In other embodiments, some or all of the positioning and plunging steps may be performed by automated handling equipment. Because the biological sample is contained in chambers 140 having silicon nitride layers 114, 124 forming the upper and lower surfaces of the chambers 140, the sample will be frozen with a thickness precisely matching the distance between the interior surfaces of those silicon nitride layers 114, 124. As a result, these grid assemblies 100 can be used to reliably and precisely form thin films of biological materials of any desired thickness. If a greater thickness is desired, a first grid support 110 having a thicker spacer layer 130 may be selected for use. If a thinner sample film is desired, first grid support 110 having a thinner spacer layer 130 may be selected.

In step 707, the biological sample is imaged using cryo-EM. The loading of the biological sample into an electron microscope can be accomplished by manual or automated means. For example, the grid assembly 100 may be transferred (e.g., manually using tweezers to hold the grid 100) to a suitable holder for use with an electron microscope. In some embodiments, a commercially-available specimen holder for cryo-EM applications may be used to hold the grid assembly 100. In these embodiments, it would be desirable for the grid assembly 100 to be provided in a size compatible with size of the specimen grids intended for use with those commercially-available holders.

Next, electron beams may be directed through the imaging apertures 150, so as to image the portion of biological sample contained in the portion of the chamber 140 corresponding to the imaging apertures 150. Because the silicon nitride layers 114, 124 are substantially transparent to electrons, the biological material can be imaged with high resolution. The cryo-EM may be performed using any suitable TEM, such as, for example, the Tecnai TF20 microscope by the FEI Company of Hillsboro, Oreg. In some embodiments, the electron dose used for imaging is no greater than 2,000 electrons/nm$^2$.

In some embodiments, the TEM imaging of non-conducting specimens (e.g. biological samples embedded in vitreous ice) can result in an increase in charge of the sample, due to inelastic scattering events leading to ionization and the consequent emission of secondary electrons. Specimen charging may cause severe problems, including, for example, distortions in the recorded images, beam induced specimen movement, and rupture of thin films. The specimen charging effects may be mitigated or eliminated by forming a thin conducting film onto the specimen or the assembly supporting the specimen. It may be possible to dope the silicon nitride films 114, 124 with, e.g., boron or phosphorous, to provide either n-type and p-type electrical conductivity in the silicon nitride film 114, 124. In other embodiments, electrical conductivity to prevent charging of the specimen may be achieved by coating either or both of the silicon nitride films 114, 124 with a very thin conducting layer, such as, e.g., a 5 nm thick film of carbon.

Figure 8:
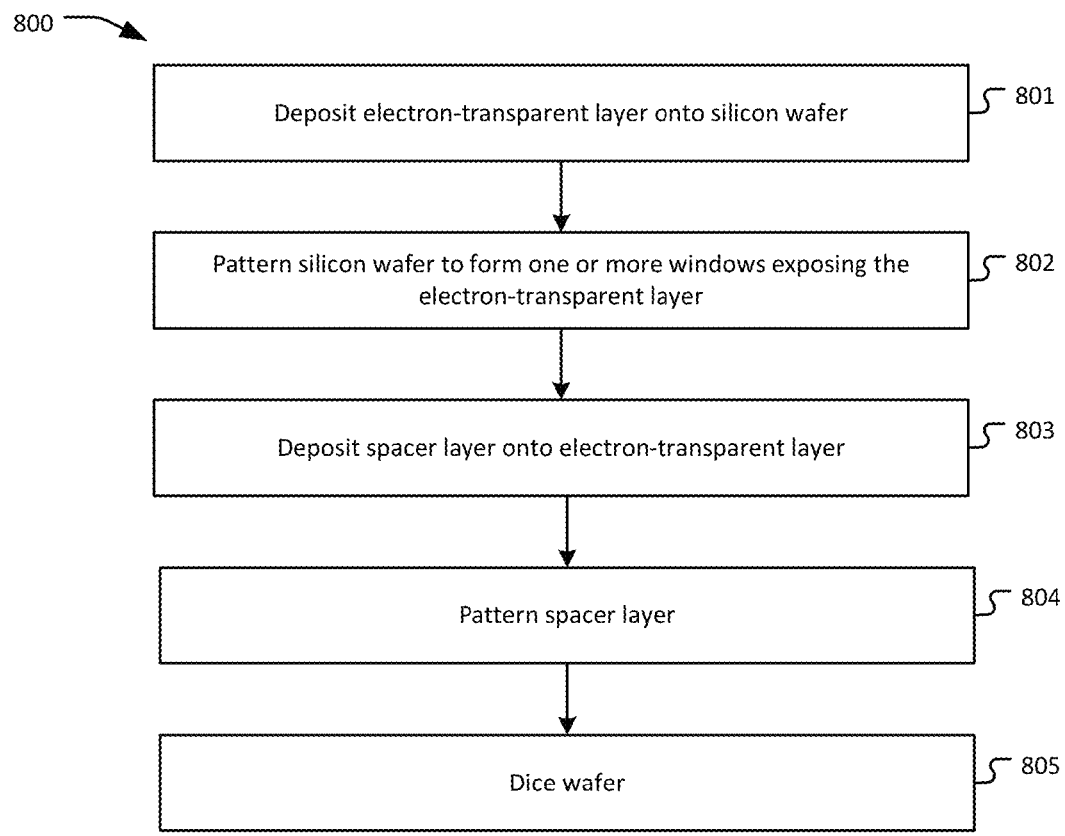
FIG. 8 is a flowchart illustrating a method of manufacturing a cryo-electron microscopy grid assembly, in accordance with embodiments of the present invention.

FIG. 8 is a flowchart illustrating a method of manufacturing a cryo-electron microscopy grid assembly in accordance with embodiments of the present invention. This manufacturing may be performed using standard nanofabrication processes.

In step 801, an electron-transparent layer, such as, e.g., silicon nitride, is deposited onto a first side of a substrate using any suitable process. The substrate may be, e.g., a commercially-available silicon wafer having a thickness of 100 µm. The silicon nitride electron-transparent layer may be deposited using a low-pressure chemical vapor deposition (CVD) process. The use of low pressure CVD to deposit silicon nitride is well known, and with a deposition rate of 2-3 nm/min, the silicon nitride layer can be formed with high control over the thickness.

In step 802, the side of the silicon wafer opposite the silicon nitride layer is patterned to form one or more windows exposing the electron-transparent layer. The silicon may be patterned using, e.g., photolithography and reactive ion etching to expose the silicon in locations defining the openings 116, 126. The silicon wafer may then be placed in a heated bath of potassium hydroxide (KOH), which anisotropically etches the exposed silicon (but not the silicon nitride) and creates the openings 116, 126. This etching process may result in the sloped sides of the openings 116, 126, as shown in FIGS. 1 and 6A-6B. If different etching processes are used, the angle of the slope of the sides of the openings 116, 126 may vary.

As described above, the spacer layer 130 is formed only on the first support member 110 and not the second support member 120. Therefore, the following steps to form the spacer layer 130 may be omitted when manufacturing the second support member 120.

In step 803, a spacer layer is deposited on the silicon nitride layer 114. The spacer layer may be formed, e.g., by depositing SiO2 onto the silicon nitride coated silicon wafer using plasma enhanced chemical vapor deposition (PECVD). The deposition rate of silicon dioxide using standard PECVD processes may be approximately 17 nm/min. As a result, the thinnest silicon dioxide layer that can be deposited using PECVD may still be greater than the desired thickness T1 for imaging. In this case, a thicker layer of silicon dioxide (e.g., about 50 nm) may be deposited. Then a slow etching process may be performed with, e.g., 1:50 diluted HF solution, which provides an etching rate of approximately 7 nm/min. A few minutes etching may then decrease the thickness of the silicon dioxide spacer to the desired thickness T1.

In step 804, the spacer layer is patterned using, e.g., photolithography, to form desired pattern of one or more channels 132. The silicon wafer may then be placed in a heated KOH bath, which anisotropically etches the exposed silicon dioxide (but not the silicon nitride) to create the desired pattern of the spacer layer 130 (e.g., to form the one or more channels 132). For the first support member 110, it may be possible to combine the etching of the silicon wafer described above with respect to step 802 with the etching of the silicon dioxide layer in step 804. Both the silicon and silicon dioxide (but not the silicon nitride) may be etched simultaneously in the same KOH bath. In other embodiments, the spacer layer may be formed on the silicon nitride layer 114 in the desired pattern, thereby eliminating the need for a subsequent etching step to form the channels 132.

In step 805, the wafer is diced to form individual support members. If a spacer layer 130 was deposited, then the dicing produces a plurality of first support members 112, which can be used as the bottom portion of the grid assembly 100. If a spacer layer 130 was not deposited, then the dicing produces a plurality of second support members 122, which can be used as the top portion of the grid assembly 100.

To reduce the background noise introduced by silicon nitride films, the deposition process may be tuned to produce a series of films with a variety of thicknesses. For example, a plurality of support members 110, 120 may be manufactured, with the thicknesses of the silicon nitride layers 114, 124 varying from, e.g., about 50 nm to about 5 nm. Atomic Force Microscopy (AFM) may be used to measure the thicknesses of the silicon nitride layers deposited. Because the biological material contained in the grid assembly 100 is frozen prior to exposing the grid assembly 100 to the vacuum of the TEM, it is not required that the silicon nitride film be as strong as might be desired when subjecting a grid containing liquid material to the TEM vacuum. However, it is desirable that the silicon nitride layers 114, 124 having suitable durability so as to survive the wet etching step without damage.

If it is desired to add a conductive element to the silicon nitride layers 114, 124, a thin layer of carbon film (e.g., approximately 5 nm thick) may be deposited on the silicon nitride film.

In the embodiments described above and illustrated in FIG. 4, the first support member 110 and the second support member 120 have rectangular openings 116, 126 which extend in substantially orthogonal directions when the support members 110, 120 are coupled to form the grid assembly 100. This cross-assembly configuration may be desirable so as to reduce the need to very precisely align the openings 116, 126 when coupling the support members 110, 120. Even if the support members 110, 120 are slightly misaligned, there may still be sufficiently large regions of overlap between the openings 116, 126 to provide an adequate number of imaging apertures having an acceptable field of view.

In other embodiments, different configurations and alignments may be used. For example, the support members 110, 120 may be aligned such that the rectangular openings 116, 126 extend in the same direction. As a result, the entire length of the openings 116, 126 are used to form three rectangular imaging apertures, instead of the nine square apertures shown in FIG. 4. This increases the total usable area for imaging.

It is possible that the freezing rate of the biological material may vary across the surface of the apertures 150. For example, at the center of the apertures 150, the freezing rate may be similar to the freezing rate achieved using conventional TEM grids because the thin silicon nitride layers 114, 124 may cause only a negligible decrease in freezing rate over a sample having one exposed side. As a result, the freezing rate at the center of the apertures may be greater than 100,000° C./second, which will result in the formation of amorphous ice. In contrast, near the edge of the apertures 150, the freezing rate may be slower because the thick silicon layers 112, 122 adjacent to the apertures 150 may serve as a heat reservoir. As a result, the ice formed towards the edges of the apertures might be crystalline ice, which may damage the biological sample. Thus, in some embodiments, it may be preferable to determine where the transition from crystalline ice to amorphous ice occurs. One potential method for determining the location of the transition region is to take a series of images from the center to the edge of the apertures 150, and characterize the morphology of the ice by looking at the Fourier transform of the images, which is equivalent to the electron diffractogram of the sample. The crystalline ice (either hexagonal or cubic ice) will have characteristic reflections in the computed diffractogram.

The variation in the ice thickness from the center to the edge of the apertures 150 may also be determined. The variation should be small, as the pressure in the liquid chambers 150 is the same as the external pressure. If it is determined that the variation is too large (e.g., larger than 10 nm for 20 nm thick ice), either the width of the windows 118, 128 can be shortened, or the thickness of the silicon nitride films 114, 124 may be increased.

The embodiments of the grid assemblies and associated methods described herein may provide a number of advantages over existing methods of performing cryo-electron microscopy, and, in particular, over the currently available TEM grids and manual/automated plungers used to prepare cryo-samples.

First, the freezing process can become a well-controlled step instead of a trial-and-error step. The thickness of the vitreous ice is defined by the spacer thickness in a very controllable way. By utilizing grid assemblies having spacer layers of different thicknesses, the thickness of the ice can be tuned to any desired value with a degree of control not previously achieved. Researchers can choose the desired ice thickness based on the estimated gyration radius of the target macromolecules, which will provide the maximum contrast in the collected cryo-EM images.

Second, the humidity in the freezing apparatus need not be controlled and no humidity-controlled equipment is required. With conventional techniques, the plunging step must be performed in a humidity-controlled environment to prevent undesirable evaporation of the biological sample solution. A piece of filter paper is used to blot away excess liquid and leave a thin aqueous layer on the TEM grid. Then the grid is plunged into cryogen. During the plunging step, the TEM grid is exposed to air, and water evaporation occurs. In accordance with embodiments of the present invention, the chamber containing the solution is covered on the top and bottom by silicon nitride layers, so either manual or automated freezing equipment can be used without the need for humidity control.

Third, the amount of sample used for imaging can be decreased from conventional techniques, e.g., by a factor of 100-10,000.

Fourth, the yield of usable region in a grid assembly is significantly higher than in samples prepared using conventional methods. Even the most efficient cryo-sample prepared using conventional methods provides fewer than thirty 40 µm×40 µm squares. However, in the cryo-samples prepared with grid assemblies in accordance with the present invention, there are at least nine 150 µm×150 µm squares. The total usable region is therefore at least four times larger.

While the invention has been described in terms of particular embodiments and illustrative figures, those of ordinary skill in the art will recognize that the invention is not limited to the embodiments or figures described. For example, in various embodiments described above, each support member is provided with three rectangular openings. However, in other embodiments, any number or shape of openings, windows, apertures, and chambers may be used. In addition, in the illustrated embodiments, the two substrates and spacer layer have approximately the same width and height, as seen in the top view shown in FIG. 4. In other embodiments, the sizes and shapes of the different layers may vary. For example, in some embodiments, the spacer layer does not extend across the entire width and/or height of the underlying first support member. Instead, the spacer layer may comprise, e.g., a plurality of columns formed across the surface of the first support member. These columns will support the second support member such that the height of the columns defines the thickness of the ice layer.

The particulars shown herein are by way of example and for purposes of illustrative discussion of the preferred embodiments of the present invention only and are presented in the cause of providing what is believed to be the most useful and readily understood description of the principles and conceptual aspects of various embodiments of the invention. In this regard, no attempt is made to show structural details of the invention in more detail than is necessary for the fundamental understanding of the invention, the description taken with the drawings and/or examples making apparent to those skilled in the art how the several forms of the invention may be embodied in practice.

As used herein and unless otherwise indicated, the terms "a" and "an" are taken to mean "one," "at least one" or "one or more." Unless otherwise required by context, singular terms used herein shall include pluralities and plural terms shall include the singular.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural and singular number, respectively. Additionally, the words "herein," "above," and "below" and words of similar import, when used in this application, shall refer to this application as a whole and not to any particular portions of the application.

The description of embodiments of the disclosure is not intended to be exhaustive or to limit the disclosure to the precise form disclosed. While specific embodiments and examples for the disclosure are described herein for illustrative purposes, various equivalent modifications are possible within the scope of the disclosure, as those skilled in the relevant art will recognize. Such modifications may include, but are not limited to, changes in the dimensions and/or the materials shown in the disclosed embodiments.

All of the references cited herein are incorporated by reference. Aspects of the disclosure can be modified, if necessary, to employ the systems, functions, and concepts of the above references and application to provide yet further embodiments of the disclosure. These and other changes can be made to the disclosure in light of the detailed description.

Specific elements of any foregoing embodiments can be combined or substituted for elements in other embodiments. Furthermore, while advantages associated with certain embodiments of the disclosure have been described in the context of these embodiments, other embodiments may also exhibit such advantages, and not all embodiments need necessarily exhibit such advantages to fall within the scope of the disclosure.

Therefore, it should be understood that the invention can be practiced with modification and alteration within the spirit and scope of the appended claims. The description is not intended to be exhaustive or to limit the invention to the precise form disclosed. It should be understood that the invention can be practiced with modification and alteration and that the invention be limited only by the claims and the equivalents thereof.

What is claimed is:

1. A system for cryo-electron microscopy, comprising:
a first support member comprising a first substrate coupled to a first electron-transparent layer, wherein the first substrate comprises one or more lower openings;
a second support member comprising a second substrate coupled to a second electron-transparent layer, wherein the second substrate comprises one or more upper openings; and
a rigid spacer layer disposed between the first support member and the second support member.

2. The system of claim 1, wherein:
the one or more lower openings comprise one or more substantially rectangular channels extending in a first direction; and
the one or more upper openings comprise one or more substantially rectangular channels extending in a second direction substantially orthogonal to the first direction.

3. The system of claim 1, wherein:
the one or more lower openings comprise a first plurality of channels extending in a first direction; and
the one or more upper openings comprise a second plurality of channels extending in a second direction substantially orthogonal to the first direction such that each channel in the first plurality of channels overlaps with each of the second plurality of channels, wherein the portions of overlapping channels form a plurality of apertures through which electrons may pass.

4. The system of claim 1, wherein:
the rigid spacer layer comprises silicon dioxide or metal deposited on the first support member.

5. The system of claim 1, wherein:
the rigid spacer layer forms one or more chambers, each chamber being aligned with a corresponding one of the lower openings and a corresponding one of the upper openings to form a aperture such that electron beams may pass through the corresponding one of the lower openings, the chamber, and the corresponding one of the upper openings.

6. The system of claim 5, wherein:
the rigid spacer layer comprises silicon dioxide or metal deposited on the first support member; and
the one or more chambers are etched from the silicon dioxide or metal.

7. The system of claim 5, further comprising:
a vitrified biological sample contained in the one or more chambers.
8. The system of claim 5, wherein:
each of the one or more chambers includes an exit portion aligned with an edge of the first support member and an edge of the second support member.
9. The system of claim 1, wherein:
the first substrate and the second substrate comprise silicon; and
the one or more lower openings are etched in the silicon of the first substrate; and
the one or more upper openings are etched in the silicon of the second substrate.
10. The system of claim 9, wherein:
the first electron-transparent layer comprises a first silicon nitride layer deposited on the first substrate; and
the second electron-transparent layer comprises a second silicon nitride layer deposited on the second substrate.
11. The system of claim 1, wherein:
the first substrate is less than approximately 300 μm thick; and
the second substrate is less than approximately 300 μm thick.
12. The system of claim 1, wherein:
the rigid spacer layer is between about 10 nm to about 300 nm thick.
13. The system of claim 1, wherein:
the first electron-transparent layer and the second electron-transparent layer are between about 10 nm to about 30 nm thick.

\* \* \* \* \*